United States Patent [19]
Finch et al.

[11] Patent Number: 5,497,458
[45] Date of Patent: Mar. 5, 1996

[54] CACHE TESTABILITY CIRCUIT FOR EMBEDDED DIAGNOSTICS

[75] Inventors: Richard Finch; Eric Schieve; Joseph Vivio, all of Austin, Tex.

[73] Assignee: Dell USA, L.P., Austin, Tex.

[21] Appl. No.: 87,583

[22] Filed: Jul. 6, 1993

[51] Int. Cl.$^6$ .................................................. G06F 11/00
[52] U.S. Cl. ............................... 395/183.06; 365/201
[58] Field of Search ..................................... 395/575, 425, 395/578; 371/15.1, 21.1; 364/964.4, 964.5, 965.1; 365/201

[56] References Cited

U.S. PATENT DOCUMENTS

| | | | |
|---|---|---|---|
| 4,575,792 | 3/1986 | Keeley | 364/200 |
| 5,195,096 | 3/1993 | Moore | 371/21.1 |
| 5,276,833 | 1/1994 | Auvinen et al. | 395/425 |
| 5,287,481 | 2/1994 | Lin | 395/425 |
| 5,341,494 | 8/1994 | Thayer et al. | 395/425 |

Primary Examiner—Robert W. Beausoliel, Jr.
Assistant Examiner—Norman M. Wright
Attorney, Agent, or Firm—James Huffman; David McCombs

[57] ABSTRACT

A memory write disable circuit which disables write operations to main memory during cache diagnostics and thus provides a generic means for testing cache memory systems. Disabling write operations to main memory allows the diagnostics to easily distinguish between cache hits and cache misses during diagnostics. The disable circuit operates by disabling the output enable for the main memory write signal. This disables writes to main memory in a manner external to the memory controller and thus allows tags to be loaded from a cacheable space in main memory. This enables the testing of cache memory systems in computer systems using integrated cache and memory controllers which prevent read hits to memory addresses whose cacheability has been disabled. This also provides a testability function that is hardware independent and thus can be used regardless of the configuration or processor used in the computer system.

12 Claims, 3 Drawing Sheets

CACHE TESTABILITY CIRCUIT FOR EMBEDDED DIAGNOSTICS

SPECIFICATION

1. Field of the Invention

The present invention relates to cache memory systems in computer systems, and more particularly to a cache testability circuit which disables writes to main memory to facilitate cache memory testing.

2. Description of the Related Art

Modern computer systems are required to manipulate and store increasingly larger amounts of code and data. One method that is commonly used to speed up memory accesses in computer systems is to utilize what is referred to as cache memory. A cache memory is a small amount of very fast, and expensive, zero wait state memory that is interposed between a device which regularly requests data and a storage device. For example, the most common type of cache memory is referred to as a microprocessor cache memory. The microprocessor cache memory is interposed between the microprocessor and main memory and stores frequently used code and data. When a microprocessor requests data and the data resides in the cache, then a cache hit occurs and the data is provided back to the microprocessor without requiring a main memory access. If the requested data does not reside in the cache, then a cache miss occurs, and the microprocessor then must retrieve the requested data from main memory.

Cache management is usually performed by a device referred to as a cache controller. The cache controller determines the organization of the cache memory as well as the write policy that is enforced. For example, a cache memory may be organized as either a direct mapped cache or a set associative cache. In order to more fully understand cache organization, it is helpful to conceptualize main memory as comprising a plurality of pages of memory of a certain size. A number of the upper address bits comprising a memory address can individually access each of these conceptual pages, while the remaining or lower address bits comprise an offset within a respective page.

In a direct mapped cache, the cache memory is organized as a single conceptual page of memory, and there is a single unique location in the cache memory where a piece of data may reside. This unique location is determined by the offset or lower address bits of the address of the respective data. Therefore, the lower address bits or offset determine where a piece of data will be stored in the cache memory. The upper address bits, referred to as the tag, are stored in a separate block of memory referred to as the tag memory or tag RAMs. Each location in the cache memory includes a corresponding tag location which stores the upper address bits of the address corresponding to the data stored in the respective cache memory location. When a memory access occurs, the cache controller performs a tag compare cycle to compare the tag location corresponding to the respective offset where the data might be stored with the upper address bits of the requested address. If the contents of the tag location equal the upper address bits of the memory access, then a cache hit occurs.

In a set associative cache design, the cache memory is organized into multiple banks or ways of cache memory wherein each bank of memory corresponds to a conceptual page in main memory. Thus, in a four-way set associative cache, a piece of data having an address can be stored in either of four places in the cache memory. As with a direct mapped cache, where the data is stored in a respective bank of memory depends on the offset or lower address bits of the address corresponding to the data, and the upper address bits or tag are stored in a corresponding tag location.

The write policies enforced by a cache controller are generally referred to as either write-through or write-back. In a write-through cache, on a write hit the data is updated in both the cache memory and in main memory simultaneously. In a write-back cache, the updated data is only written back to main memory when the need arises, such as when another device requests this data from main memory.

As with main memory, the cache memory must generally be tested during power-up of the computer system to ensure that the memory is operating properly. Prior to testing a cache memory, it is first necessary to determine the size of the cache memory. Cache sizing is necessary because subsequently employed cache memory testing routines are typically required to fill the entire cache memory space with data patterns and then perform accesses to this stored data. One problem with sizing and testing a cache memory is that it is difficult to determine whether the processor is accessing data that resides in the cache memory or actually accessing data in main memory. This problem arises because a quickly responding read from main memory sometimes appears to the processor as if it were a cache memory read.

Prior art methods for discerning differences between a cache memory access and a main memory access have used timing methods. Generally, a cache memory access is much faster than a main memory access, and thus a cache memory access can be distinguished from a main memory access based on response time. However, timing methods generally cannot be used in embedded diagnostic routines because there are a multitude of different processor speeds that can be used in the system. Floppy disk based diagnostics routines can be utilized which use software timing loops based on the processor speed in the respective system being tested. However, this requires a number of different floppy disks for computers having different processor speeds. In addition, loading a floppy disk to perform diagnostics at every power-up is very inconvenient for the user. A diagnostic routine may also rely upon hardware based system timers. However, hardware based timers introduce hardware dependencies into the diagnostic testing and thus may need to be modified in subsequent computer systems. Therefore, a method and apparatus is required which provides the ability to size and test cache memory systems independent of the particular hardware configuration in which the cache memory is embedded.

Another method that has been used to distinguish between cache memory and main memory accesses in order to perform robust cache memory sizing and testing is to create a cacheable address space which is either not readable or not writable or both. If the cacheable address space is not writable, then on write hits to the cache memory the data will only be stored in the cache memory. Thus, a pattern of data written to addresses which are cached will result in storage of the respective data in the cache memory, and this data will not be stored in the non-writable main memory. This creates a disparity between the data stored in the cache memory and the data stored in main memory. Thus, on subsequent reads of these addresses, the return data will provide a ready indication of whether a cache hit or cache miss occurred. Similarly, if the main memory is not readable, read cycles issued by the processor can only be serviced by the cache memory. This also provides a ready indication between cache hits and cache misses.

One method that has been used to obtain either non-readable or non-writable cacheable address space is to load data and tag addresses into the cache memory and tag RAMs, respectively, and then disable the main memory. Main memory that has been disabled or is otherwise invalid is both non-readable and non-writable and thus serves the desired purpose. Therefore, a memory space that is cacheable but yet has no actual valid main memory for data storage enables a simple and ready method for distinguishing between a cache memory access and a main memory access.

Another prior art method that has been used to provide a cacheable space with no actual main memory is to designate logical address space cacheable that does not have any corresponding physical memory. Thus, on subsequent memory accesses, cache hits will result in data being provided from the cache memory, whereas on cache misses no actual physical memory is present for the logical address generated. This also provides a ready method for distinguishing between cache hits and cache misses during memory sizing and testing.

In each of the above methods where main memory has been either disabled or is not present, the memory controller will designate addresses corresponding to this memory space as non-cacheable. Therefore, one requirement of the above methods is that the cache controller must have the ability to respond to cache hits regardless of the cacheability indicated by the memory controller. However, new chip sets such as the Intel 82424TX cache and DRAM controller (CDC) include a combined cache controller and DRAM or memory controller which does not allow the cache controller to respond to cache hits where the corresponding memory address space has been rendered non-cacheable. Thus, simply disabling or invalidating the main memory after the cache has been loaded does not allow cache memory testing because the memory controller will not allow cache hits to occur if the requested address corresponds to memory that has been disabled or is otherwise non-cacheable. In addition, creating a cacheable logical address space that does not have corresponding physical memory is not possible since the memory controller will maintain this address space non-cacheable due to physical memory not being present. Therefore, a method and apparatus is desired which allows the testing of cache memory in systems having integrated cache and memory controllers which do not allow cache hits to non-cacheable memory locations.

Another method to achieve either non-readable or non-writable cacheable address space is to use cacheable Read Only Memory (ROM). Since cacheable ROM is by definition read only, a diagnostic program can distinguish between cache misses and cache hits by simply writing a data pattern to the respective addresses and then reading this data back. One problem with this method is that in many systems a cacheable read only memory is a feature not provided by the memory controller in the respective computer system.

SUMMARY OF THE INVENTION

The present invention comprises a DRAM disable circuit which provides a generic means for testing cache memory systems. The disable circuit comprises a buffer which receives a write signal from the memory controller and provides this signal to main memory. During cache memory diagnostics this buffer is disabled, preventing writes to main memory. This disables writes to main memory in a manner external to the memory controller and thus allows tags to be loaded from a cacheable space in main memory. The memory controller believes main memory is valid and thus maintains the address space cacheable. However, since writes to main memory are disabled, cache testing can be performed whereby read misses, cycles to main memory, can be distinguished from read hits. This enables the testing of cache memory systems in computer systems using integrated cache and memory controllers which prevent read hits to memory addresses whose cacheability has been disabled. This also provides a testability function that is hardware independent and thus can be used regardless of the configuration or processor used in the computer system.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
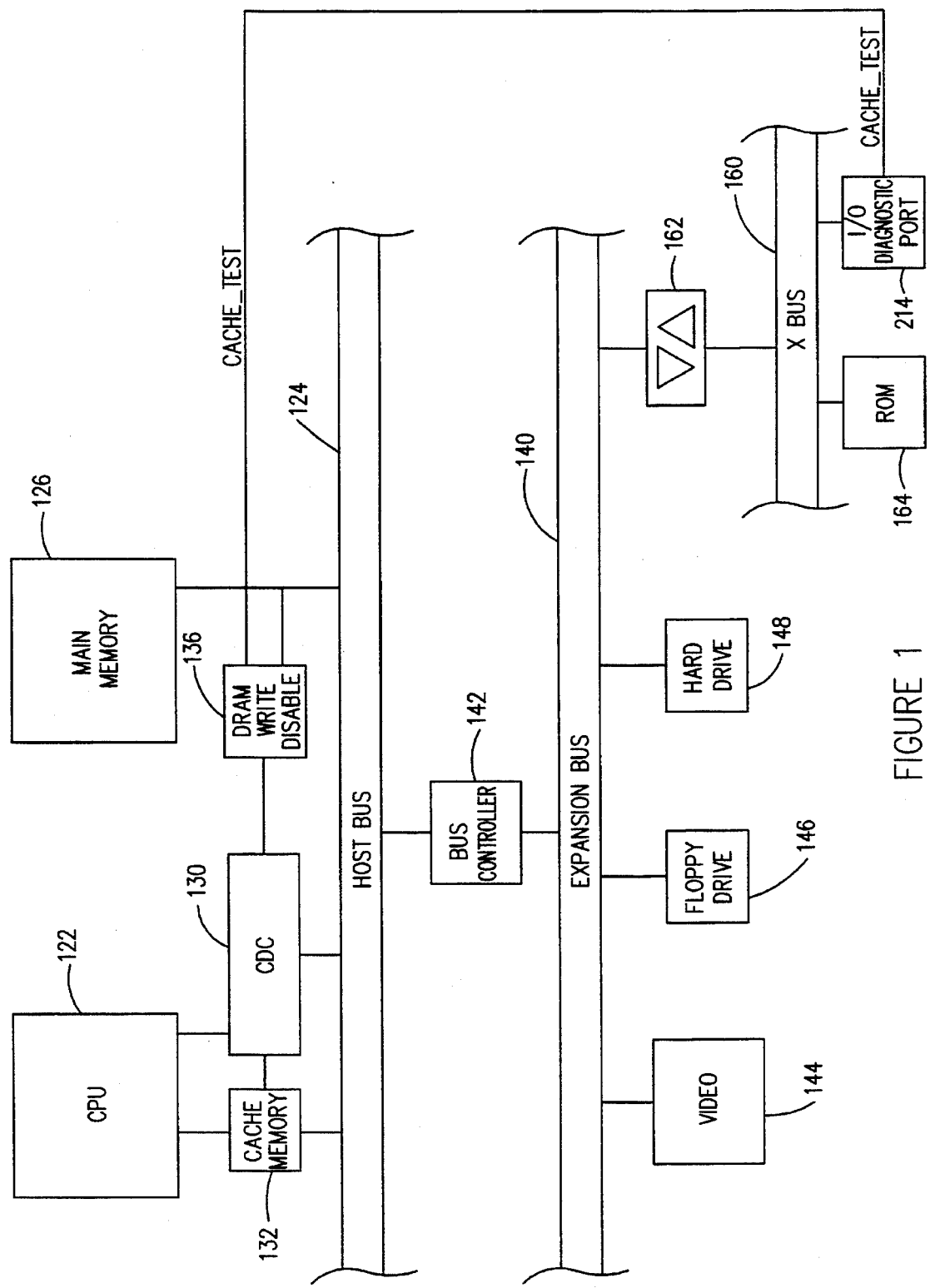
FIG. 1 is a computer system according to one embodiment of the invention.

Referring now to FIG. 1, a computer system incorporating the present invention is shown. The elements of a computer system not necessary to understand the operation of the present invention have been omitted for simplicity. The computer system includes a central processing unit or CPU 122 which is coupled to a memory or host bus 124. The CPU 122 includes a cache memory 132 coupled between the CPU 122 and the host bus 124. The CPU 122 may also include a separate internal cache memory (not shown). The host bus 124 includes address, data, and control portions. Main memory 126 comprised of dynamic random access memory (DRAM) is coupled to the host bus 124.

A combined cache and DRAM controller (CDC) 130 which integrates both cache controller and memory controller logic is coupled to the CPU 122, the cache memory 132, main memory or DRAM 126 and the host bus 124. In the preferred embodiment, the CDC 130 is the 82424TX produced by Intel. The CDC 130 preferably does not allow cache hits to tag addresses that are not cacheable or whose cacheability has been disabled. A DRAM write disable circuit 136 according to the present invention is coupled between the CDC 130 and main memory 126. As discussed below, the DRAM write disable circuit 136 disables write operations to main memory 126 during cache memory diagnostics to create a cacheable address space corresponding to non-writable physical memory. This allows cache hits to be distinguished from cache misses during diagnostics and thus enables cache memory sizing and testing.

The host bus 124 is coupled to an expansion or input/output (I/O) bus 140 by means of a bus controller 142. The expansion bus 140 includes slots for various other devices, including video 144, a floppy drive 146 and hard drive 148. The expansion bus 140 is also connected to a third peripheral bus referred to as the X bus 160 through a buffer 162. Coupled to the X bus 160 are read only memory (ROM) and an I/O diagnostic port 214. The ROM 164 is preferably designated as non-cacheable by the CDC 130. The I/O diagnostic port 214 acts as a signal source in the preferred embodiment of the invention and is used during cache memory diagnostics as follows. During diagnostics at power-up, the CPU 122 writes a bit to the diagnostics port 214, which asserts a signal referred to as CACHE_TEST to the DRAM write disable circuit 136. The CACHE_TEST signal directs the DRAM write disable circuit 136 to disable writes to the main memory 126, as discussed below.

As discussed in the background portion, it is important that both main memory 126 and the cache memory 132 be tested during Power On Self Test (POST) to ensure that all memory components are working properly. When testing a cache memory system 132, it is first necessary to determine the size of the cache memory 132 prior to testing. Sizing the cache memory 132 is necessary prior to testing because cache memory testing routines typically operate by filling the entire cache memory space with data patterns and then performing read accesses to test the results. Both cache memory sizing and testing require a determination as to whether the processor is accessing data in the cache memory 132 or actually accessing main memory 126. This determination is many times difficult because a quickly responding read from main memory 126 may appear to the CPU 122 as a cache memory read.

Methods that have been used to distinguish between cache memory reads and main memory reads involve creating a cacheable memory address space wherein the physical main memory is invalid or has been disabled. However, the cache and memory controller logic used in the preferred embodiment of the invention, the Intel 82424TX CDC, operate such that the memory controller prevents cache read hits to tag addresses whose cacheability has been disabled. Therefore, it is no longer possible to simply disable the main memory or DRAM after loading the cache memory 132 because subsequent cache reads will be designated non-cacheable by the memory controller in the CDC 130.

Another method that has been used is to create a cacheable memory address space wherein the corresponding physical memory is not present. However, the CDC 130 of the preferred embodiment does not allow a cacheable address space corresponding to physical memory that is not present. Another method has been to use cacheable ROM. However, the CDC 130 does not allow cacheable ROM.

Therefore, the present invention operates by disabling write operations to main memory 126. The memory or DRAM controller 210 (FIG. 2) in the CDC 130 still believes that main memory 126 is both readable and writable and thus maintains the address space cacheable. In this manner, cache memory testing can be performed whereby read misses (cycles to DRAM) can be easily distinguished from read hits.

Figure 2:
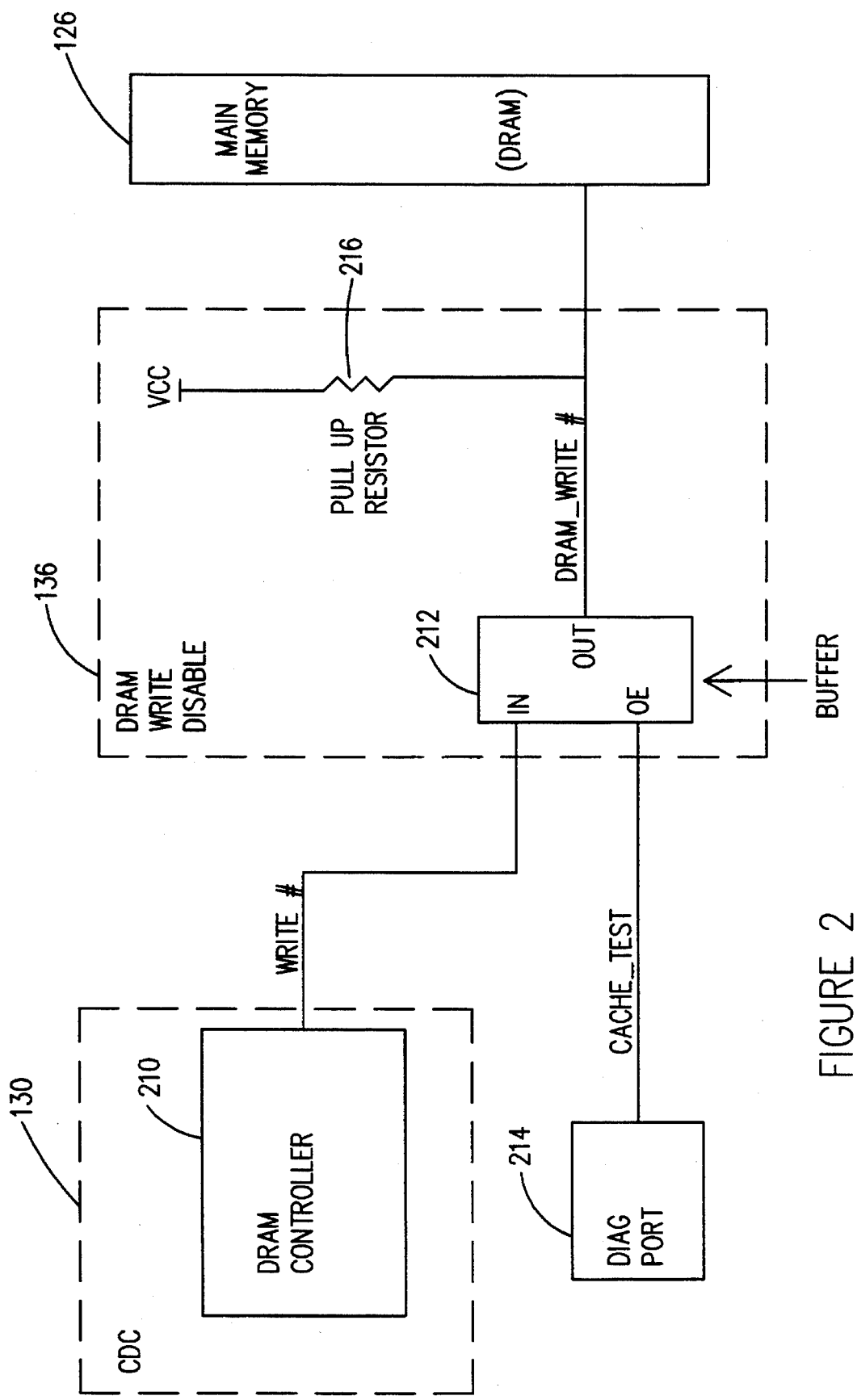
FIG. 2 illustrates the DRAM disable circuit according to one embodiment of the invention.

Referring now to FIG. 2, the DRAM disable circuit according to the preferred embodiment of the invention is shown. In the description that follows, a "#" sign following a signal indicates that the signal is asserted when it has a logic low value. As shown, DRAM controller 210 comprised in the CDC 130 generates a write signal referred to as WRITE# to the input of a write buffer 212 comprised in the DRAM write disable circuit 136. The diagnostic port 214 provides the CACHE_TEST signal to the output enable (oe) input of the buffer 212. The buffer 212 provides an output signal referred to as DRAM_WRITE# to the main memory or DRAM 126. When the CACHE_TEST signal is asserted, the output of the buffer 212 is disabled. The DRAM_WRITE# signal is also connected through a pull-up resistor 216 to a positive voltage supply +VCC. The pull-up resistor 216 maintains the DRAM_WRITE# signal at a logic high value (+VCC) when the CACHE_TEST signal is asserted and the output of the buffer 212 is floated.

When cache memory diagnostics are being performed, the CPU 122 writes a bit to the diagnostic port 214 which causes the port to assert the CACHE_TEST signal to the output enable pin of the output buffer 212. This disables assertion of the DRAM_WRITE# signal to the main memory 126 and thus prevents writes from occurring to main memory 126.

Figure 3:
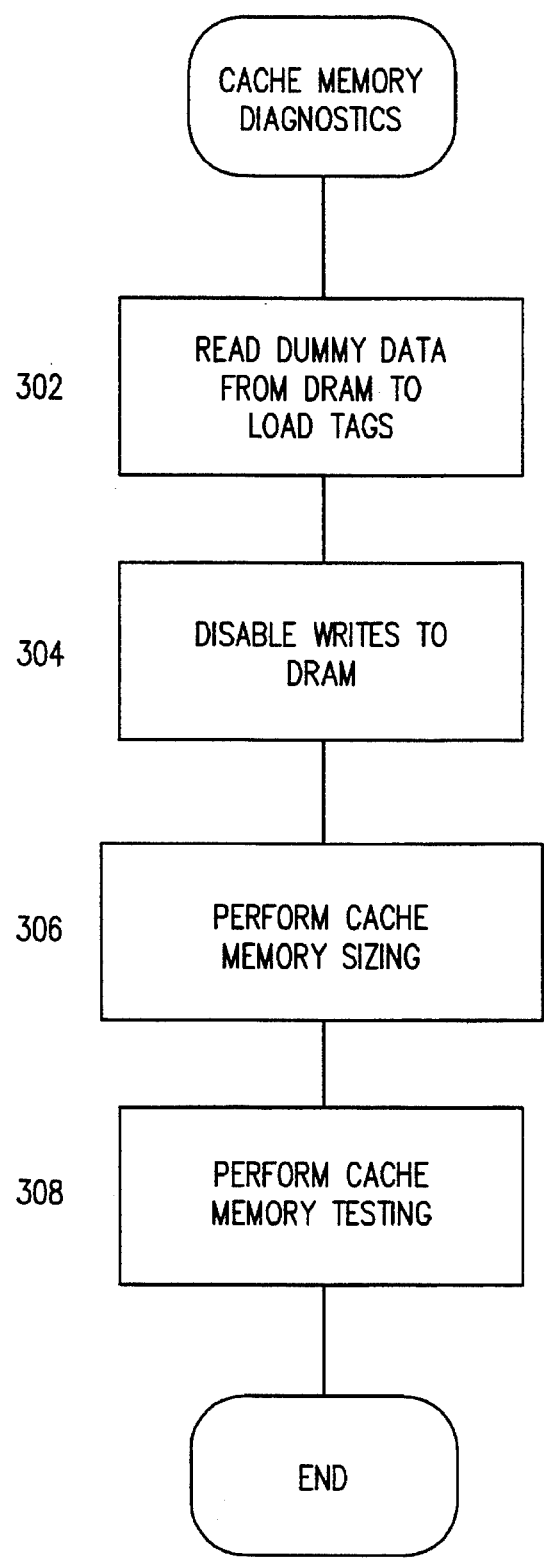
FIG. 3 illustrates a method for performing cache testability diagnostics utilizing the circuit in FIG. 2.

Referring now to FIG. 3, a flowchart diagram illustrating operation of the cache memory testing method of the present invention is shown. In step 302 the CPU 122 reads data from the main memory or DRAM 126 to load tags into the cache memory 132. In this step, the CPU 122 is reading dummy data from the DRAM 126. This dummy data is stored in the cache memory 132, and the upper address bits comprising the tag are stored in the tag RAMs comprised within the CDC 130. This read is done solely to load tags into the tag RAMs in the CDC 130. In the cache system of the preferred embodiment, write misses do not generate cache allocations and thus do not load tag addresses into the tag RAMs. Therefore a read to load the tag RAMs is necessary. However, it is noted that if the cache system performs cache allocations on write misses, then CPU write operations can be used to load the tag RAMs as desired.

In step 304 the CPU 122 writes a bit to the diagnostic port 214, and the port asserts the CACHE_TEST signal to the output enable pin of the DRAM write buffer 212. As discussed above, this serves to disable assertion of the DRAM_WRITE# signal and thus disables all writes to main memory 126. It is noted that step 304 can precede step 302, and writes to the DRAM 126 can be disabled prior to reading data from the DRAM 126 to load the tag RAMs. Disabling writes to the DRAM 126 prior to the read in step 302 serves to lock the current data into the DRAM 126 prior to reading dummy data into the cache memory 132.

In step 306 the CPU 122 performs a cache sizing algorithm to determine the size of the cache memory 132. This cache sizing algorithm can be any of several types that are used, as is well known in the art. For more information on specific cache memory sizing algorithms, please see related co-pending application Ser. No. 08/043,508 titled "Cache Memory Sizing Procedure" whose inventor is Eric William Schieve, and which is assigned to the same assignee as the present application, which is hereby incorporated by reference.

In step 308 the CPU 122 performs the desired cache memory testing algorithm. The cache memory testing algorithm may include writing patterns to the cache memory 132 and then subsequently reading these patterns back to test for memory integrity. It is noted that any of various types of cache memory testing algorithms can be performed, as is well known in the art.

Therefore, a method and apparatus for performing cache memory sizing and testing is shown. The computer system includes a circuit which disables write operations to the DRAM 126 to enable the CPU 122 to distinguish between cache read hits and cache read misses. By disabling writes to main memory 126 in this manner, the memory controller 210 in the CDC 130 still believes that main memory 126 is valid and thus maintains the address space cacheable. This enables cache memory sizing and testing in computer systems which do not allow cache read hits to occur to non-cacheable and/or invalid memory locations. This also provides a testability function that is hardware independent and thus can be used regardless of the configuration or processor used in the computer system.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. An apparatus for disabling writes to, but not reads from, main memory in a computer system during cache memory diagnostics, wherein the computer system comprises a CPU, cache memory coupled to the CPU, a cache controller coupled to the CPU and the cache memory, main memory, and a memory controller coupled to the main memory, the CPU, and the cache controller, the apparatus comprising:

a buffer coupled between the memory controller and the main memory which receives a write signal from the memory controller and provides said write signal to the main memory; and a signal source coupled to said buffer which asserts a disable signal to said buffer during cache memory diagnostics, wherein said disable signal prevents assertion of said write signal to the main memory during said cache memory diagnostics but does not prevent assertion of read signals to the main memory during said cache memory diagnostics.

2. The apparatus of claim 1, wherein said memory comprises a plurality of memory locations forming an address space and portions of said address space can be designated cacheable or noncacheable by the memory controller;

wherein if a portion of said memory locations corresponding to a first address space is disabled, the memory controller designates said first address space to be non-cacheable; and wherein the memory controller does not allow hits to the cache memory involving memory addresses corresponding to a non-cacheable address space.

3. The apparatus of claim 2, wherein the memory controller and the cache controller are the Intel 82424.

4. The apparatus of claim 1, wherein said buffer includes an output enable input; and wherein said disable signal is asserted to said output enable input of said buffer to disable outputs from said buffer.

5. The apparatus of claim 1, wherein said signal source comprises a port.

6. A computer system which performs cache memory diagnostics, comprising:

a CPU;

cache memory coupled to the CPU;

a cache controller coupled to the CPU and the cache memory;

main memory;

a memory controller coupled to the main memory, the CPU, and the cache controller;

a buffer coupled between the memory controller and the main memory which receives a write signal from the memory controller and provides said write signal to the main memory; and a signal source coupled to said buffer and the CPU which asserts a disable signal to said buffer during cache memory diagnostics, wherein said disable signal prevents assertion of said write signal to the main memory during said cache memory diagnostics but does not prevent assertion of read signals to the main memory during said cache memory diagnostics.

7. The computer system of claim 6, wherein said main memory comprises a plurality of memory locations forming an address space and portions of said address space can be designated cacheable or noncacheable;

wherein if a portion of said memory locations corresponding to a first address space are disabled, the memory controller designates said first address space to be non-cacheable; and wherein the memory controller does not allow hits to the cache memory involving memory addresses corresponding to a non-cacheable address space.

8. The computer system of claim 7, wherein the memory controller and the cache controller are the Intel 82424.

9. The computer system of claim 6, wherein said buffer includes an output enable input; and wherein said disable signal is asserted to said output enable input of said buffer to disable outputs from said buffer.

10. The computer system of claim 6, wherein said circuit comprises a port.

11. A method for performing cache memory diagnostics in a computer system comprising a CPU, a cache system coupled to the CPU including cache memory and a cache controller, main memory, and a memory controller coupled to the main memory, the CPU, and the cache controller, wherein the memory controller does not allow hits to the cache memory involving memory addresses corresponding to a non-cacheable address space, and a buffer coupled between the memory controller and the main memory which receives a write signal from the memory controller and provides said write signal to the main memory, the method comprising:

disabling write operations to, but not read operations from, the main memory by disabling operation of said buffer;

loading tag addresses into the cache system; and testing the cache memory after performing said steps of disabling and loading.

12. The method of claim 11, further comprising:

sizing the cache memory after performing said steps of disabling and loading and before said step of cache memory testing.

* * * * *